United States Patent
Pazidis et al.

(10) Patent No.: US 12,546,921 B2
(45) Date of Patent: Feb. 10, 2026

(54) MIRROR ASSEMBLY AND OPTICAL ASSEMBLY COMPRISING SAME

(71) Applicant: Carl Zeiss SMT GmbH, Oberkochen (DE)

(72) Inventors: Alexandra Pazidis, Essingen-Lautenburg (DE); Kerstin Hild, Waldstetten (DE); Thilo Pollak, Neresheim (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 563 days.

(21) Appl. No.: 17/685,427

(22) Filed: Mar. 3, 2022

(65) Prior Publication Data
US 2022/0187516 A1 Jun. 16, 2022

Related U.S. Application Data

(63) Continuation of application No. PCT/EP2020/069905, filed on Jul. 14, 2020.

(30) Foreign Application Priority Data

Sep. 3, 2019 (DE) .................. 10 2019 213 345.2

(51) Int. Cl.
*G02B 5/08* (2006.01)
*G03F 7/00* (2006.01)
*G03F 7/20* (2006.01)

(52) U.S. Cl.
CPC ......... *G02B 5/0891* (2013.01); *G02B 5/0816* (2013.01); *G03F 7/70166* (2013.01); *G03F 7/70233* (2013.01); *G03F 7/70883* (2013.01)

(58) Field of Classification Search
CPC .............. G02B 5/0891; G02B 5/0816; G02B 26/0825; G02B 1/18; G03F 7/70166; G03F 7/70233; G03F 7/70883
(Continued)

(56) References Cited

U.S. PATENT DOCUMENTS 4,056,588 A * 11/1977 Baniel ................. C04B 35/6306
264/658
5,986,795 A 11/1999 Chapman et al.
(Continued)

FOREIGN PATENT DOCUMENTS

CN 1841212 A 10/2006
CN 107077076 A 8/2017
(Continued)

OTHER PUBLICATIONS

Chinese Office Action English translation, Application No. 202080075933.0, Oct. 10, 2023, 8 pages.
(Continued)

*Primary Examiner* — Stephone B Allen
*Assistant Examiner* — Boutsikaris Leonidas
(74) *Attorney, Agent, or Firm* — Edell, Shapiro & Finnan, LLC

(57) ABSTRACT

A mirror arrangement (30) includes: a substrate (31) with a front side (31a) having a mirror face (32a) reflecting radiation (5), and a rear side (31b) facing away from the front side and on which at least one actuator (27) generating deformations of the mirror face is arranged. A water vapor (36)-sorbing material (33, 42) is formed on the rear side (31b) and forms an adhesive layer (33) for securing the actuator. The layer extends into interspaces (35) between the actuators (27). A surface (33a, 42a) of the water vapor-sorbing material is covered at least partly by a coating (37) which forms a water vapor diffusion barrier.

8 Claims, 4 Drawing Sheets

(58) Field of Classification Search
USPC ........................................................ 359/838
See application file for complete search history.

(56) References Cited

U.S. PATENT DOCUMENTS

| | | | |
|---|---|---|---|
| 10,852,643 B2 | 12/2020 | Juergens et al. | |
| 2005/0162762 A1* | 7/2005 | Novak | G02B 26/0825 |
| | | | 359/849 |
| 2006/0018045 A1* | 1/2006 | Moeller | G02B 5/10 |
| | | | 359/838 |
| 2006/0077503 A1 | 4/2006 | Palmateer et al. | |
| 2006/0221314 A1 | 10/2006 | Wilhelmus Jacobs et al. | |
| 2010/0239822 A1 | 9/2010 | Pelizzo et al. | |
| 2011/0019295 A1* | 1/2011 | Rooms | G02B 26/0825 |
| | | | 359/849 |
| 2011/0211268 A1* | 9/2011 | Camet | G02B 26/0825 |
| | | | 359/849 |
| 2011/0299183 A1* | 12/2011 | Mansell | G02B 26/0825 |
| | | | 359/849 |
| 2012/0120378 A1* | 5/2012 | Chung | G03F 1/38 |
| | | | 156/60 |
| 2013/0070356 A1* | 3/2013 | Camet | G02B 26/0825 |
| | | | 359/849 |
| 2013/0169590 A1* | 7/2013 | Wickboldt | G02B 1/105 |
| | | | 345/174 |
| 2013/0215527 A1* | 8/2013 | Beresnev | G02B 26/0825 |
| | | | 359/849 |
| 2016/0017213 A1* | 1/2016 | Zhang | C09K 8/80 |
| | | | 507/224 |
| 2017/0192360 A1 | 7/2017 | Prochnau et al. | |
| 2017/0363861 A1 | 12/2017 | Hauf et al. | |
| 2018/0196253 A1* | 7/2018 | Kwan | G02B 26/0825 |
| 2018/0264527 A1* | 9/2018 | Li | B08B 7/0028 |
| 2019/0064405 A1 | 2/2019 | Grasse et al. | |
| 2022/0252864 A1* | 8/2022 | Kuiper | G02B 26/0825 |

FOREIGN PATENT DOCUMENTS

| | | |
|---|---|---|
| CN | 107430267 A | 12/2017 |
| CN | 109154680 A | 1/2019 |
| DE | 102004051838 A1 | 5/2005 |
| DE | 102012202850 A1 | 8/2013 |
| DE | 102017213176 A1 | 9/2017 |
| JP | H1114876 A | 1/1999 |
| JP | 2004226457 A | 8/2004 |
| JP | 2013500593 A | 1/2013 |
| JP | 2017083824 A | 5/2017 |
| JP | 2018534602 A | 11/2018 |
| WO | 2018177724 A1 | 10/2018 |
| WO | 2013124224 A1 | 8/2019 |

OTHER PUBLICATIONS

Wimmer et al., "Water sorption mechanisms of commercial wood adhesive films", Wood Sci Technology, (2013), 13 pages.
Klumbies et al., "Thickness dependent barrier performance of permeation barriers made from atomic layer deposited alumina for organic devices", Organic Electronics 17 (2015), pp. 138-143.
German Office Action with English translation, Application No. 102019213345.2, Mar. 25, 2020, 10 pages.
International Search Report, PCT/EP2020/069905, Oct. 23, 2020, 4 pages.
International Preliminary Report on Patentability, PCT/EP2020/069905, Mar. 8, 2022, 10 pages.
Japanese Office Action with English translation, Application No. 2022-514236, Apr. 23, 2024, 13 pages.
Chinese Office Action with English translation, Application No. 202080075933.0, Mar. 13, 2024, 12 pages.
Chinese Office Action with English translation, Application No. 202080075993.0, Nov. 22, 2024, 16 pages.
Chinese Office Action with English translation, Application No. 202080075933.0, Feb. 19, 2025, 15 pages.

* cited by examiner

MIRROR ASSEMBLY AND OPTICAL ASSEMBLY COMPRISING SAME

CROSS-REFERENCE TO RELATED APPLICATION

This is a Continuation of International Application PCT/EP2020/069905, which has an international filing date of Jul. 14, 2020, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2019 213 345.2 filed on Sep. 3, 2019.

FIELD OF THE INVENTION

The invention relates to a mirror arrangement comprising: a substrate which comprises a front side having a mirror face for reflecting radiation, and a rear side facing away from the front side and on which is arranged an actuator or a plurality of actuators, in the form, for example, of an actuator assembly or multiple actuator assemblies, for generating deformations of the mirror face. A water vapor-sorbing, in particular organic material is formed or disposed on the rear side of the substrate. The water vapor-sorbing material preferably forms an adhesive layer for securing the at least one actuator on the rear side of the substrate, said adhesive layer extending in particular into interspaces between the actuators. The invention also relates to an optical arrangement, in particular an EUV lithography apparatus or a DUV lithography apparatus, having at least one such mirror arrangement.

BACKGROUND

The mirror arrangement described above enables targeted (local) deformation of the mirror face, formed on the front side of the substrate, with actuators secured on the rear side of the substrate. The deformation of the mirror face may serve, for example, to carry out targeted correction of aberrations of an EUV lithography apparatus or DUV lithography apparatus in which the mirror arrangement is disposed. The actuators may for this purpose be secured in a regular arrangement or in a grid (actuator array) on the rear side of the substrate, though in principle any desired arrangement of the actuators on the rear side of the substrate is possible. Adjacent actuators or adjacent groups of actuators (actuator assemblies) generally do not border one another directly in places on the rear side of the substrate, but are instead spaced apart from one another, meaning that an interspace or a gap is formed between pairs of adjacent actuators or actuator assemblies.

U.S. Pat. No. 5,986,795 describes a deformable mirror for EUV radiation wherein actuators are disposed between a front plate, which forms the rear side of the mirror, and a reaction plate and are coupled to both plates, in order to bring about deformations at the mirror face of the deformable mirror.

Another possibility for the securement or for the coupling of the actuators to the substrate is to secure the actuators indirectly, i.e., via one or more interlayers, or directly on the rear side of the substrate, with an adhesive bond, for example. In the case of securement in the form of an adhesive bond, the problem is that the composition of the gas atmosphere in the surroundings of the mirror arrangement is not constant over time and is altered, for example, when the mirror arrangement is first introduced or is installed into an optical arrangement or when the optical arrangement undergoes maintenance, repair, etc. The latter is the case in particular when the optical arrangement is operated under vacuum conditions or with purging gas and yet for the purpose of repair, maintenance, etc., it is necessary to interrupt the vacuum or the purge. In that case there is an alteration in particular in the humidity present in the surroundings of the mirror arrangement, in other words the amount of water vapor in the surroundings.

If the adhesive layer or another water vapor-sorbing material, organic material for example, connected mechanically directly or indirectly to the substrate takes up moisture from the surroundings, this layer or this material expands, and stresses may be introduced into the material. The stresses in the material are generally transmitted to the substrate, and so the substrate may suffer deformations, resulting in a drift, i.e., in an (unwanted) alteration over time, of the mirror surface. Because of the material-related drift, therefore, aberrations occur in the beam path of the optical arrangement. The other organic material may be contained in the actuators and/or formed on the actuators, though it is also possible for the organic material to be connected directly to the rear side of the substrate or to an interlayer which is formed there.

SUMMARY

It is an object of the invention to provide a mirror arrangement and also an optical arrangement comprising at least one such mirror arrangement, in which deformations of the substrate that are brought about by alterations in humidity in the surroundings of the mirror arrangement are reduced.

This object is achieved, according to a first aspect, by a mirror arrangement of the aforementioned kind wherein a surface of the water vapor-sorbing material, in particular a surface of the adhesive layer, is covered at least partly, in particular completely, by a coating which forms a water vapor diffusion barrier.

If the humidity of the surroundings is constant, the surface of the water vapor-sorbing material is in equilibrium with the surroundings. If there is an alteration in humidity in the surroundings of the water vapor-sorbing material, diffusion processes are induced in the material and lead, in the case of an increase in the humidity of the surroundings, to an expansion of the material and to the deformations described above. The consequences of water sorption for an adhesive which is used for bonding wood are described for example in the article "Water sorption mechanisms of commercial wood adhesive films" of R. Wimmer et al., Wood Science and Technology, 47(4), April 2013.

In connection with this aspect of the invention, the proposal is to protect the surface of the material, which would otherwise be subject, unprotected, to humidity fluctuations in the surroundings, from the penetration of water vapor with a water vapor diffusion barrier in the form of a coating.

Generally it is advantageous if the amount of water vapor sorbed by the material is reduced overall by the water vapor diffusion barrier in the form of the coating; in other words, if the material sorbs water vapor more slowly than would be the case without the coating. In other words, a retardation of the penetration of water vapor into the material by the coating serving as a water vapor diffusion barrier brings about an improvement, since in this way the stress or force transmitted to the substrate per unit time can be reduced.

The coating which serves as a diffusion barrier for the water vapor may comprise one or more layers. The coating may be applied over the full area to the exposed surface of the material, but it is also possible for the coating to be applied only to a subregion of the surface of the material— that is, that there are regions on the surface of the material on which no coating is applied. In this case as well, the area of material exposed to the surroundings is reduced and, correspondingly, unwanted deformations in the substrate are reduced.

In the surface regions not covered by the coating, other measures may optionally be undertaken in order to reduce deformations in the substrate—for example, a force decoupling between the adhesive layer and the substrate, as is described later on below.

The coating which forms the water vapor diffusion barrier may also cover surface regions with inorganic materials and in particular may cover the entire rear side of the substrate and also all components connected mechanically to that side, since this may simplify the operating regime.

For reasons of legibility, the term "adhesive" or "adhesive layer" is frequently used below to represent any water vapor-sorbing, in particular organic material which is mechanically connected directly or indirectly to the mirror substrate. The examples which follow are given by way of example for an adhesive layer between the actuators, though of course the adhesive layer may also extend over the outer edges of the actuators or may be located on the actuator(s) itself (themselves).

The adhesive layer is typically applied two-dimensionally to the rear side of the substrate, and hence is not confined to the region between a respective actuator and the rear side of the substrate, but instead also extends over the interspaces between the actuators and/or around the outer edge regions of the actuators. In the region of the interspaces the adhesive layer may be thicker than in the region between the respective actuators and the rear side of the substrate, but it is also possible for the adhesive layer to be applied thinly enough that in the interspaces or gaps between the actuators it is not thicker than the adhesive layer under the actuators, or is present more thinly or only tapering out in the interspaces.

In one embodiment the coating comprises at least one diffusion barrier layer having a water vapor transmission rate which is lower than a water vapor transmission rate of a layer of the same thickness that consists of the water vapor-sorbing material, in particular of the material of the adhesive layer. A diffusion barrier layer of this kind therefore has a lower transmission rate for water vapor than, for example, an adhesive layer of identical thickness. The water vapor transmission rate ("moisture vapor transmission rate", MVTR) is a measurement of the transmissibility of water vapor through an arrangement of material. The water vapor transmission rate is determined by measuring the quantity of water transiting through one square meter of the arrangement of material in 24 hours. The water vapor transmission rate is reported as transited water in grams per square meter per day, i.e., in the units $g/(m^2 \, d)$. The water vapor transmission rate of an arrangement of material may be determined by direct measurements or by indirect measurements, in the manner, for example, as described in the article "Thickness dependent barrier performance of permeation barriers made from atomic layer deposited alumina for organic devices", H. Klumbies et al., Organic Electronics 17 (2015), 138-143 for the example of $Al_2O_3$ applied through atomic layer deposition. The water vapor transmission rate of a material may also be reduced by a surface treatment which makes the material of the diffusion barrier layer more impervious to the penetration of water vapor. A surface treatment of this kind may be, for example, a plasma treatment or a treatment with UV radiation. The water vapor transmission rate of the diffusion barrier layer ought typically to be less than 1 $g/(m^2 \, d)$.

In one embodiment the diffusion barrier layer comprises at least one material selected from the group comprising: $Al_2O_3$, $SiO_2$, $Ta_2O_5$, $TiO_2$, $HfO_2$, $ZrO_2$, $Nb_2O_5$, $La_2O_3$, Al, Ta, Ti, Ru, $Si_xC_yO_zH_v$, parylenes, in particular halogenated, especially fluorinated, parylenes, fluoropolymers, in particular polytetrafluoroethylene (Teflon or Teflon varieties, e.g. Teflon AF from Dupont), and also mixtures thereof. The materials in this group have a relatively low water vapor transmission rate. In order to increase the diffusion barrier effect, the coating may comprise a plurality of diffusion barrier layers composed of different materials; in other words, the coating may be a multilayer coating.

The materials indicated earlier on above, and other materials, of the coating and/or of the diffusion barrier layer may be applied by various coating techniques to the adhesive layer and, respectively, to any underlying layer of the coating that is present. The material may be deposited from a gas phase, for example, through physical vapor deposition (PVD), chemical vapor deposition (CVD), in particular plasma-enhanced CVD (PECVD), atomic layer deposition (ALD) or plasma ALD, by sputtering, by arc coating, or else by spin coating or in a sol-gel process. The nature of the coating method may be selected as a function of the nature of the material deposited. For example, $Si_xC_yO_zH_v$, or SiCOH may be deposited by PECVD, using TMCTS (tetramethylcyclotetrasiloxane) as a precursor. Generally it is advantageous, for obtaining a good barrier effect, if the material of the diffusion barrier layer is applied in a manner such that the layer has a maximum density and as far as possible no pinholes through which water vapor can penetrate into the underlying adhesive layer. The coating may also be applied by a combination of two or more of the processes described above, which are performed in succession.

In one embodiment a surface of the coating and/or the material of the diffusion barrier layer are/is hydrophobic. In general, it is advantageous if the surface of the coating that faces the surroundings is hydrophobic, since in this way the take-up of moisture by the coating or by the respective diffusion barrier layer can be further reduced if this coating or layer forms the surface of the coating that faces the surroundings. The surface of the coating or the material of the diffusion barrier layer may be rendered hydrophobic, for example, by a surface treatment, for example by a plasma treatment and/or by an (optionally pulsed) irradiation with UV radiation, by a coating or by surface termination.

In a further aspect of the invention, which may be combined with the aspect described earlier on above, the surface of the adhesive layer, in particular in the interspaces between the actuators, is covered at least partly, in particular completely, by a filling material whose elasticity modulus is less than the elasticity modulus of the adhesive layer. The filling material is preferably ductile as well, meaning that it is plastically deformable under load.

With this aspect of the invention, the penetration of water vapor into the filling material is not prevented, but because of the lower elasticity modulus of the filling material, there is a force decoupling, meaning that the filling material transmits significantly less force to the substrate or to the actuators than the adhesive, despite the filling material sorbing the same amount or possibly more water than the adhesive. Another factor exploited in the case of this aspect is that on rapid changes in the humidity in the surroundings of the optical element, the water vapor penetrates for the most part into an upper volume region of the adhesive layer and is released into the surroundings again from the upper volume region when comparatively dry surroundings are re-established. If the filling material is sufficiently thick, a rapid change in the humidity in the surroundings is accompanied by the penetration of water only into the filling material, but only to a small extent into the underlying adhesive layer, and so in this case there is only a reduced short-term adhesive drift, if any.

In one embodiment the elasticity modulus of the filling material is less than 1500 MPa, preferably less than 1000 MPa, in particular less than around 500 MPa. For the adhesives typically used, based for example on epoxy resin, the elasticity modulus is between around 3000 MPa and 6000 MPa, meaning that the elasticity modulus of the filling material is at least less than half that of the adhesive.

In another embodiment the filling material is hydrophobic, to prevent or significantly reduce the penetration of water or of water vapor into the filling material. The filling material in this case is a nonpolar material which has no permanent dipole moment. The material may in particular be wax or grease (e.g., vacuum grease, i.e., grease which can be used under vacuum conditions, or desiccator grease, i.e., grease for sealing a desiccator).

The filling material is preferably selected from the group comprising: rubber, liquid rubber, wax, grease or a liquid, in particular a (hydrophobic) oil. Rubbers, or elastomers, have a low elasticity modulus. Liquid rubber, which is based on a synthetic rubber, may be applied by spraying, brushing, etc. to the surface of the adhesive layer. Wax or grease not only has a low elasticity modulus but also, generally, hydrophobic properties. A liquid, such as a hydrophobic oil, for example, is fully flexible and can cover the entire surface of the adhesive layer in order to protect it from the penetration of water. A vertical or lateral combination of different filling materials is also possible. For example, a wax, for example, may be applied first, and additionally covered with an oil. Alternatively or additionally, some surface regions may be covered with a filling material in the form of an elastomer, and others with a wax.

In a further aspect of the invention, the surface of the water vapor-sorbing material, in particular in the interspaces between the actuators, is covered at least partly, in particular completely, by a flexible material, in particular by a film. The flexible material, in particular in the form of a film, may be introduced into the interspaces between the actuators and may connect to or be firmly adhered to the surface of the adhesive. The film may cover the interspaces between the actuators two-dimensionally. In particular, a single film may cover the actuators and the interspaces between the actuators. The film may be adhered to those surfaces of the actuators that face away from the substrate, without this film protruding into the interspace. Alternatively the film may protrude into the respective interspaces between the actuators. The film or flexible material may in this case cover, in particular, only a subregion of a respective interspace, meaning that the film is introduced into an interspace between the actuators and is not connected to the actuators which delimit the interspace, and so, in spite of the film introduced, a part of the surface of the adhesive layer between the actuators is exposed.

As is the case with the coating described earlier on above, the flexible material or the film may also form a diffusion barrier. In this case the material of the film, optionally in the form of a material incorporated into the film, in the form of a layer, for example, has a water vapor transmission rate which is lower than the water vapor transmission rate of a layer of the same thickness composed of the water vapor-sorbing material. The film may be, for example, an aluminum-laminated polymer film. This, however, is not absolutely necessary, since the film may serve for force decoupling between the adhesive layer and the substrate, in other words to interrupt the force lines which in the case of adhesive drift transmit the force from the adhesive to the structure (the actuators), and/or to relocate these lines away from the actuators.

In one development the film protrudes into a respective interspace and the film covers a preferably pot-shaped or groove-shaped depression in the adhesive layer in the respective interspace. In the case of this development the film is typically not secured, or at least not directly secured, on the actuators, and so a part of the surface of the adhesive layer is exposed. On the top side of the depression, the film has free ends, which if adhesive drift occurs are able to move toward one another and away from one another and which in this way reduce the transmission of force from the adhesive to the actuators and therefore to the substrate. In this way it is possible to reduce, in particular, an adhesive drift occurring on a short time scale (see above), affecting essentially diffusion processes in the upper part of the adhesive layer. With a short-term adhesive drift of this kind, a mechanical stress/large forces is/are introduced primarily into the upper part of the adhesive layer. In order to secure the film on the adhesive layer, it is typically placed onto the adhesive layer before the adhesive has completely dried. To form a depression in the adhesive layer, a pressure is exerted onto the top side of the film in order to displace the adhesive in the region of the depression.

As well as the adhesive drift occurring on a short timescale, which is limited essentially to the upper part of the adhesive layer, there is also an adhesive drift which operates on a longer timescale (long-term adhesive drift) and for which the entire volume of the adhesive layer sorbs or releases water. The introduction of the film into the pot-shaped or trench-shaped depression in the adhesive layer, however, reduces not only the proportion of the exposed surface of the adhesive layer, but also the entire volume occupied by the adhesive layer. In this way it is possible to reduce not only the short-term adhesive drift but also the long-term adhesive drift. It will be appreciated that as well as small as possible a volume of the adhesive layer, the subregion on the surface of the adhesive layer that is covered by the film ought also to be as small as possible, in order to minimize the force exerted on the actuators by the adhesive layer. In this way it is possible in particular to reduce the transmission of force in a direction parallel to the surface of the adhesive layer, which exerts a lateral force and hence a lever effect on the actuators.

In a further aspect of the invention, which may optionally be combined with one or more of the aspects described above, the adhesive layer does not completely cover the rear side of the substrate in the interspaces between the actuators. In the case of the aspect described here, the adhesive layer is interrupted in the interspaces between the actuators, meaning that the adhesive layer does not run continuously and is confined substantially to the surface region on the rear side of the substrate on which the actuators are adhered to the substrate. As a result of the short-term adhesive drift described earlier on above, there are stresses/there is a force effect which runs substantially parallel to the surface of the adhesive layer. Since the surface of the adhesive layer runs substantially parallel to the rear side of the substrate in the case of an adhesive layer applied continuously, an adhesive layer of this kind exerts a force effect on the actuators delimiting the interspace that runs parallel to the rear side of the substrate, presses against a side face of the actuators, and exerts a lever effect on the actuators.

Because of the interruption of the adhesive layer, in a respective interspace the surface of the adhesive layer no longer runs parallel to the rear side of the substrate, meaning that the direction of force is changed, in order to avoid a lever effect on the actuators. Because of the interruption in the adhesive layer, however, the exposed surface of the adhesive layer is typically increased, and so the absolute force effect of the adhesive layer is generally likewise increased. The resultant force effect of the adhesive layer on the actuators and therefore on the substrate is dependent, consequently, on the specific geometry of the adhesive layer interrupted. Ideally the—interrupted—adhesive layer does not protrude into the interspaces between the actuators; however, a certain excess adhesive is unavoidable/is necessary for secure bonding.

In a further aspect of the invention, which may optionally be combined with one or more of the aspects described earlier on above, the adhesive layer projects over the actuators in the interspaces. In this way as well, it is possible to realize a force decoupling which enables the short-term adhesive drift to be suppressed or reduced, since the adhesive in the projecting part of the adhesive layer is able to expand laterally, hence enabling the force effect of the adhesive to be decoupled from the actuators. The projecting adhesive layer may be combined in particular with one or more of the aspects of the invention described earlier on above: For example, the part of the adhesive layer that is not covered by the film introduced into the interspace may project over the actuators. The surface of the projecting part of the adhesive layer may also be covered wholly or partly by a coating which forms a hydrogen diffusion barrier. It will be appreciated that the multiple aspects of the invention may also be combined advantageously with one another in a way other than that set out here.

In another embodiment the actuators are configured as piezo actuators or as electrostrictive actuators. Actuators can be used to generate very small deformations in the substrate, in a targeted way. The actuators may, for example, be linear actuating motors which exert a substantially pointwise force effect on the substrate. It will be appreciated that instead of the actuators stated, other kinds of actuators may also be used. The actuators may be disposed in particular in the manner of a grid on the rear side of the substrate.

A further aspect of the invention relates to an optical arrangement, in particular an EUV lithography apparatus or a DUV lithography apparatus, which comprises at least one mirror arrangement as described earlier on above. For the purposes of this application, a lithography apparatus is understood to be an (optical) apparatus which can be used in the field of lithography. Apart from a lithography unit which serves for the production of semiconductor components, the apparatus in question may be, for example, an inspection system for the inspection of a photomask used in a lithography unit (and hereinafter also referred to as a reticle), for the inspection of a semiconductor substrate to be structured (and hereinafter also referred to as a wafer), or a metrology system which is used for measuring a lithography unit or parts thereof, for the purpose, for example, of measuring a projection system.

The optical arrangement or the lithography apparatus may in particular be an EUV lithography apparatus which is configured for used radiation of wavelengths in the EUV wavelength range between around 5 nm and around 30 nm, or may be a DUV lithography apparatus which is configured for used radiation in the DUV wavelength range between around 30 nm and around 370 nm. The optical elements of an EUV lithography apparatus are typically operated in vacuum surroundings. With an EUV lithography apparatus comprising a mirror arrangement configured as described earlier on above, it is possible to save on waiting times at start-up and/or when the vacuum is broken, as during opening, for example, if at least the short-term adhesive drift is reduced: In this case, after a change in the humidity, the lithography apparatus undergoes a more rapid transition into a (quasi-)steady state and can be used more quickly for (exposure) operation. It will be appreciated that the use of the mirror arrangement described earlier on above is not confined to lithography apparatuses, but that it may also be used advantageously in other applications, as for example in mask inspection systems.

Further features and advantages of the invention are evident from the following description of exemplary embodiments of the invention, with reference to the figures of the drawing showing details associated with the invention, and from the claims. The individual features can each be realized individually by themselves or as a plurality in any desired combination in one variant of the invention.

BRIEF DESCRIPTION OF THE DRAWINGS

Exemplary embodiments are illustrated in the schematic drawing and are explained in the following description. In the figures.

DETAILED DESCRIPTION

In the following description of the drawings, identical reference signs are used for equivalent or functionally equivalent components.

Figure 1:
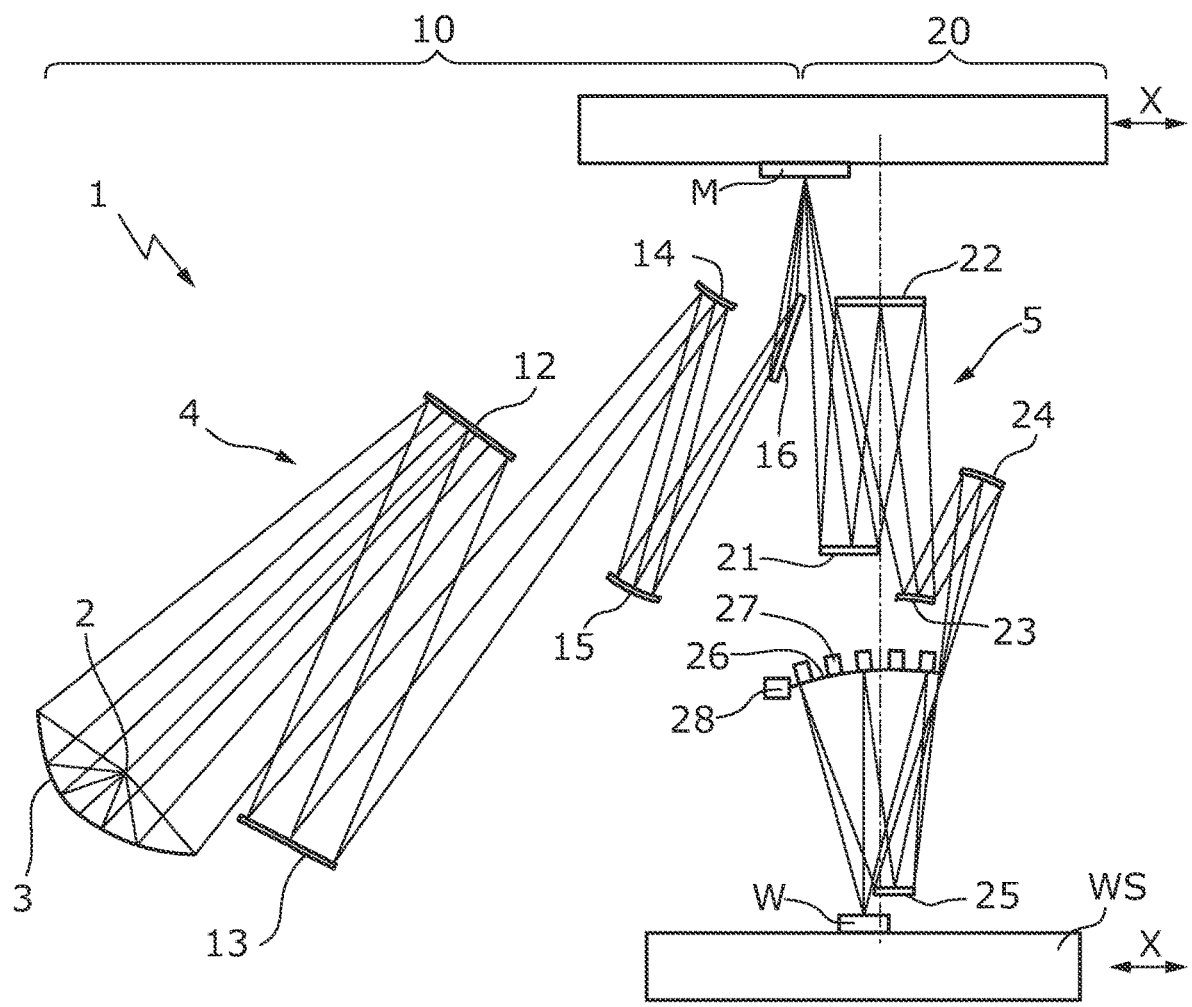
FIG. 1 shows a schematic representation of an EUV lithography unit having a mirror which comprises a plurality of actuators for correcting aberrations.

FIG. 1 schematically shows the construction of an apparatus for EUV lithography in the form of an EUV lithography unit 1, specifically of a so-called wafer scanner. The EUV lithography unit 1 comprises an EUV light source 2 for generating EUV radiation, which has a high energy density in the EUV wavelength range below 50 nanometers, in particular between approximately 5 nanometers and approximately 15 nanometers. The EUV light source 2 can be configured for example in the form of a plasma light source for generating a laser-induced plasma. The EUV lithography unit 1 shown in FIG. 1 is designed for an operating wavelength of the EUV radiation of 13.5 nm. However, it is also possible for the EUV lithography unit 1 to be configured for a different operating wavelength in the EUV wavelength range, such as 6.8 nm, for example.

The EUV lithography unit 1 further comprises a collector mirror 3 in order to focus the EUV radiation of the EUV light source 2 to form a bundled illumination beam 4 and in this way to increase the energy density further. The illumination beam 4 serves for the illumination of a structured object M with an illumination system 10, which in the present example has five reflective optical elements 12 to 16 (mirrors).

The structured object M can be for example a reflective photomask, which has reflective and non-reflective, or at least less reflective, regions for producing at least one structure on the object M. Alternatively, the structured object M can be a plurality of micro-mirrors, which are arranged in a one-dimensional or multi-dimensional arrangement and which are optionally movable about at least one axis, in order to set the angle of incidence of the EUV radiation on the respective mirror.

The structured object M reflects part of the illumination beam 4 and shapes a projection beam path 5, which carries the information about the structure of the structured object M and is radiated into a projection lens 20, which generates a projected image of the structured object M or of a respective partial region thereof on a substrate W. The substrate W, for example a wafer, comprises a semiconductor material, for example silicon, and is disposed on a mounting, which is also referred to as a wafer stage WS.

In the present example, the projection lens 20 has six reflective optical elements 21 to 26 (mirrors) in order to generate an image of the structure that is present on the structured object M on the wafer W. The number of mirrors in a projection lens 20 typically lies between four and eight; however, only two mirrors can also be used, if appropriate.

In addition to the reflective optical elements 3, 12 to 16, 21 to 26, the EUV lithography apparatus 1 also comprises non-optical components, which can be for example carrying structures for the reflective optical elements 3, 12 to 16, 21 to 26, sensors, actuators, etc. Represented illustratively in FIG. 1 are a plurality of actuators 27 which are mounted on the rear side of the sixth mirror 26 of the projection lens 20 in order to carry out targeted deformation of this mirror and, in so doing, to compensate aberrations which occur when the structure is imaged onto the wafer W with the projection lens 20. For the targeted driving of the actuators 27, the EUV lithography unit 1 comprises a control device 28 in the form, for example, of a control computer, which communicates with the actuators 27 via signal lines which are not represented in the image.

Figure 2:
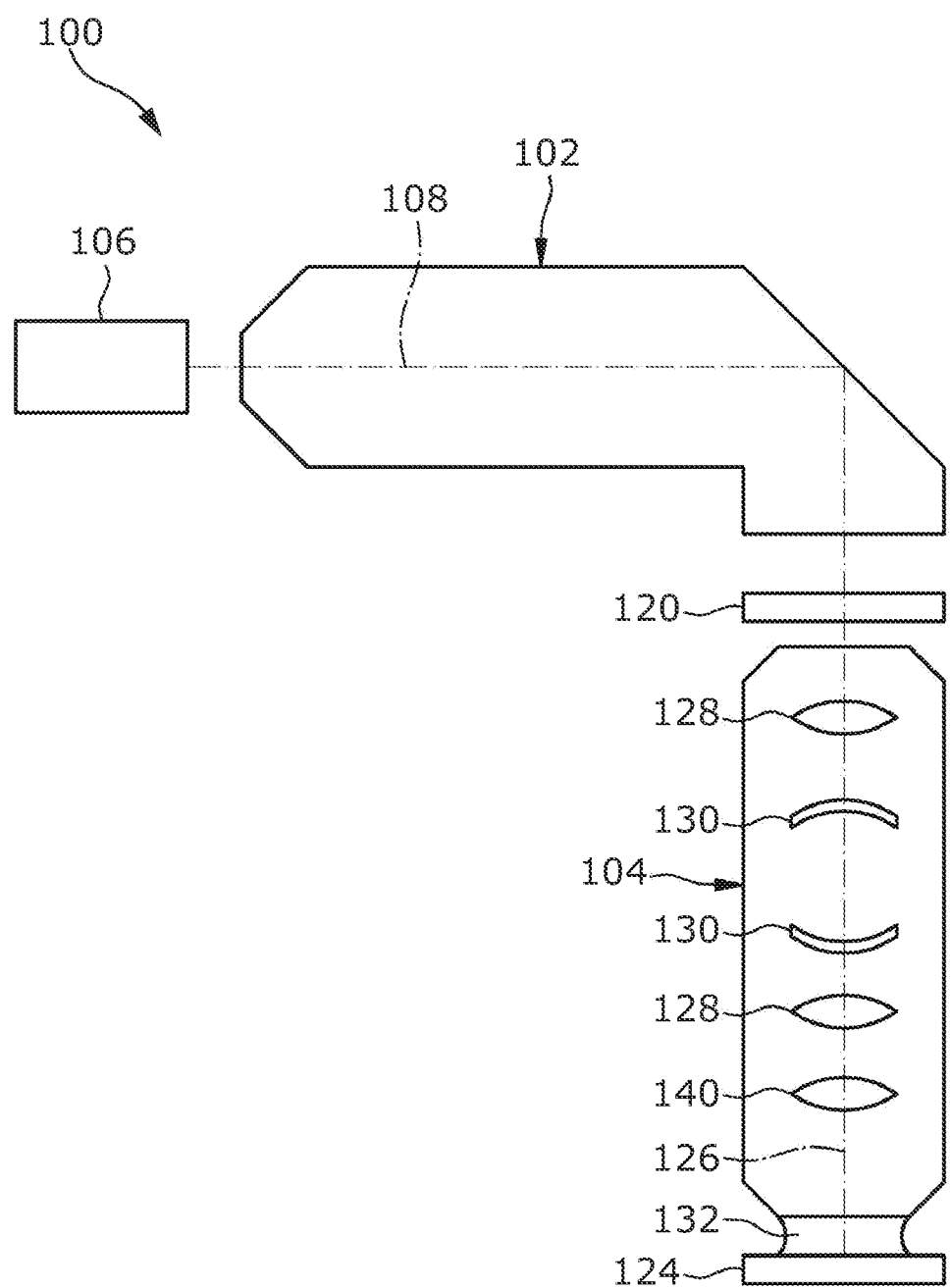
FIG. 2 shows a schematic representation of a DUV lithography unit having a mirror which comprises a plurality of actuators for correcting aberrations.

FIG. 2 shows a schematic view of a of a DUV projection exposure unit 100, which comprises a beam shaping and illumination device 102 and a projection lens 104. In this case, DUV stands for "deep ultraviolet" and denotes a wavelength of the working light of between 30 nm and 370 nm. The DUV projection exposure unit 100 comprises a DUV light source 106. For example, an ArF excimer laser that emits radiation 108 in the DUV range at 193 nm, for example, may be provided as the DUV light source 106.

The beam shaping and illumination device 102 shown in FIG. 2 directs the DUV radiation 108 onto a photomask 120. The photomask 120 is formed as a transmissive optical element and may be arranged outside the beam shaping and illumination device 102 and the projection lens 104. The photomask 120 has a structure which is projected onto a wafer 124 or the like with the projection lens 104.

The projection lens 104 has a number of lens elements 128, 140 and/or mirrors 130 for projecting the photomask 120 onto the wafer 124. In this case, individual lens elements 128, 140 and/or mirrors 130 of the projection lens 104 may be arranged symmetrically in relation to the optical axis 126 of the projection lens 104. It should be noted that the number of lens elements and mirrors of the DUV projection exposure unit 100 is not restricted to the number shown. More or fewer lens elements and/or mirrors may also be provided. Furthermore, the mirrors are generally curved on their front side for beam shaping.

An air gap between the last lens element 140 and the wafer 124 may be replaced by a liquid medium 132 which has a refractive index of >1. The liquid medium 132 may be for example high-purity water. Such a set-up is also referred to as immersion lithography and has an increased photolithographic resolution.

Figure 3:
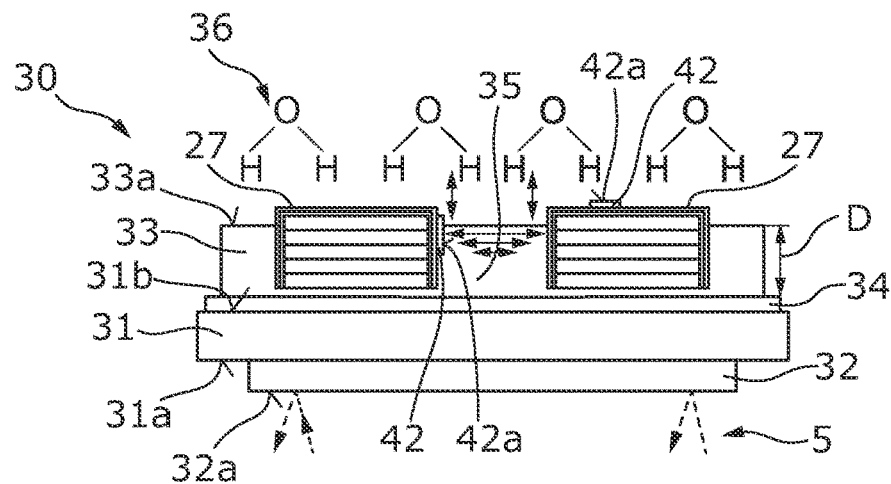
FIG. 3 shows a schematic sectional representation of the mirror arrangement of FIG. 1 with an adhesive layer for securing the actuators on a substrate.

FIG. 3 shows the mirror 26 of FIG. 1 or the mirror 130 from FIG. 2 as part of a corresponding mirror arrangement 30, in a detailed representation. The mirror arrangement 30 comprises a substrate 31 which in the example shown is formed of titanium-doped fused silica (ULE) or fused silica. Other materials which have a low coefficient of thermal expansion or a very low dependence of the coefficient of thermal expansion on the temperature may likewise be used as substrate materials. Applied to a front side 31a of the substrate 31 is a reflective coating 32 configured in such a way that incident EUV radiation 5 or DUV radiation 108 is reflected with a comparatively high reflectivity in a narrow spectral range around the operating wavelength of 13.5 nanometers or, for example, 193.4 nanometers for a specified range of angles of incidence.

In the case of the EUV mirror 26 of FIG. 1, the reflective coating 32 is configured such that it acts as an interference layer system for the EUV radiation 5 to be reflected. In this case the reflective coating 32 comprises, in alternation, first layers of a first layer material in the form of silicon and second layers of a second layer material in the form of molybdenum. Different first and second layer materials, in the form of molybdenum and beryllium, for example, are likewise possible, depending on the operating wavelength.

The mirror arrangement 30 shown in FIG. 3 may also be formed, correspondingly, on a mirror 130, illustrated in FIG. 2, of the DUV projection exposure unit 100. A mirror 130 of this kind likewise comprises a substrate 31 and a reflective coating 32. The substrate 31 in this case may consist, for example, of fused silica. The reflective coating 32 in this case is configured such that incident DUV radiation 5 is reflected with a comparatively high reflectivity in a narrow spectral range around the operating wavelength of the DUV light source 106, of 157 nm, 193 nm, 248 nm or 360 nm, for example, for a specified range of angles of incidence. In this case as well, the reflective coating 32 may be configured as a multilayer system, in order, through interference effects, to generate a maximum reflectivity of the mirror 130. The DUV mirror 130 may alternatively be a metal mirror, a protective metal mirror or a dielectric-enhanced metal mirror.

Serving for the targeted local deformation of a mirror face 32a formed on the reflective coating 32 are the actuators 27, which in the case of the example shown in FIG. 3 are configured as piezo actuators. The actuators 27 are secured with an adhesive layer 33 on the rear side 31b of the substrate 31. The adhesive layer 33 may be applied directly to the rear side 31b of the substrate 31; in the example shown, however, there is an interlayer 34 applied to the rear side 31b of the substrate 31, and the adhesive layer 33 is applied to this interlayer 34. The material of the interlayer 34 may comprise, for example, Cr, V, Si, Al, Ta, Ti, $Al_2O_3$, $Ta_2O_5$, $TiO_2$, chromium oxide, vanadium oxide, $La_2O_3$, $ZrO_2$.

In the example shown the adhesive layer 33 (except in the region of the actuators 27) has a constant thickness D and is applied two-dimensionally to the rear side 31b of the substrate 31. The actuators 27 are partly embedded into the adhesive layer 33 and project over the adhesive layer 33 at their top side or end-face side. The actuators 27 are adhered on the rear side 31b of the substrate 31, spaced apart from one another in a two-dimensional grid. To simplify the illustration, only two directly adjacent actuators 27 are shown in FIG. 3, with an interspace 35 formed between them. It will be appreciated that in the grid, generally, a significantly larger number of actuators 27 are present, with each pair of adjacent actuators 27 separated from the others by an interspace 35. The interspace 35 between the actuators 27 generally have the same width, meaning that the actuators 27 are distributed uniformly over the rear side 31b of the substrate 31. The actuators 27 may also form an assembly which has gaps or interspace 35, or a plurality of actuator assemblies may be applied on the rear side 31b of the substrate 31.

The adhesive layer 33 extends not only under the actuators 27 or between the actuators 27 and the rear side 31b of the substrate 31, but also into a respective interspace 35 between two adjacent actuators 27. In the case of the example illustrated in FIG. 3, the thickness D of the adhesive layer 33 is selected such that the interspace 35 is filled almost completely by the adhesive layer 33. The thickness D of the adhesive layer 33 may alternatively be selected such that it is not greater than the distance between the bottom side of the actuators 27 and the rear side 31b of the substrate 31, or the interlayer 34. The adhesive layer 33 may also be thinner or may have an irregular thickness D.

The reflective optical elements 3, 12 to 16 of the illumination system 10 and also the reflective optical elements 21 to 26 of the projection lens 20 of the EUV lithography unit 1 of FIG. 1 are disposed in vacuum surroundings in which there is a residual gas atmosphere. The reflective elements in the illumination system 102 and also the reflective elements 130 in the projection lens 104 of the DUV lithography unit 100 of FIG. 2 are arranged in purged surroundings having a residual partial pressure of $H_2O$. In the surroundings of the mirror arrangement 30 and hence also in the surroundings of the adhesive layer 33 there is a small fraction of water vapor 36, the concentration of which is substantially constant in steady-state operation of the EUV lithography unit 1 or of the DUV lithography unit 100. A portion of the water vapor 36 diffuses via the surface 33a out of the adhesive layer 33, meaning that at constant ambient humidity the adhesive layer 33 or the surface 33a thereof is in dynamic equilibrium. In the dynamic equilibrium, the amount of water vapor diffusing into the adhesive layer 33 by way of the surface 33a is the same as the amount of water vapor 36 emerging from the surface 33a. The inward and outward diffusion is indicated in FIG. 3 by two double arrows running vertically.

In the event of a change in humidity in the surroundings of the mirror arrangement 30, the dynamic equilibrium is disturbed. This is the case in particular when there is an abrupt rise in the water partial pressure in the surroundings of the mirror arrangement 30, as may be the case, for example, in the course of maintenance, repair, etc. of the EUV lithography unit 1 or of the DUV lithography unit 100. In the event of an abrupt change in the ambient humidity, there is a short-term adhesive drift during which the adhesive or the adhesive layer 33 rapidly sorbs or releases water by way of the surface 33a, this leading to an expansion or a contraction of the adhesive of the adhesive layer 33, thereby generating stresses in the adhesive layer 33. In the event of an abrupt increase in the ambient humidity, the adhesive layer 33 sorbs water in its upper part, and this causes the adhesive of the adhesive layer 33 to expand in a lateral direction, i.e., substantially parallel to the surface 33a of the adhesive layer, and in this process stresses are generated in the adhesive layer 33, as indicated in FIG. 3 by double arrows running horizontally.

The stresses in the adhesive layer 33 which are indicated by the double arrows in FIG. 3 and which run parallel to the surface 33a of the adhesive layer 33 lead to a corresponding input of force onto the mutually facing side faces of the two adjacent actuators 27. This input of force generates a lever effect on the actuators 27, which results in unwanted tilting of the actuators 27 and hence unwanted deformations of the substrate 31.

In the case of the mirror arrangement 30 shown in FIG. 3, not only is the adhesive layer 33 formed of a water vapor-sorbing, generally organic material; instead, an organic material 42 is formed on the actuators 27, and is connected to the top side or to the side of a respective actuator 27. The organic material 42 may comprise, for example, protective layers for the actuators 27, insulator layers, embedding material for (electrical) lines, conductive adhesive or adhesive for supply lines. With the water vapor 36-sorbing organic material 42 as well, the problem exists that, in the event of a change in the humidity in the surroundings of the mirror arrangement 30, water vapor diffuses into/out of the organic material 42 by way of the surface 42a, and this may lead to deformations of the substrate 31.

There are various possibilities for avoiding deformations of the substrate 31 because of the material drift; a number of such possibilities are described in more detail below with reference to FIG. 4 to FIG. 10, illustratively, on the basis of the adhesive layer 33.

Figure 4:
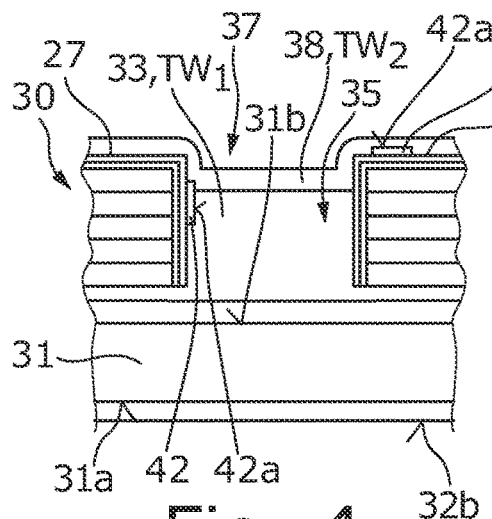
FIG. 4 shows a schematic representation of a detail of the mirror arrangement with a coating which is applied to a surface of the adhesive layer and which forms a water vapor diffusion barrier.

In the case of the example shown in FIG. 4, a coating 37 which forms a diffusion barrier is applied to the surface 33a of the adhesive layer 33 in the respective interspaces 35. In the interspaces 35, the coating 37 covers the surface 33a of the adhesive layer 33 completely. In FIG. 4 the coating 37 consists of an individual diffusion barrier layer 38, which has a water vapor transmission rate $TW_1$ that is less than the water vapor transmission rate $TW_2$ of a layer which consists of the material of the adhesive layer 33 and has the same thickness as the diffusion barrier layer 38 ($TW_1 < TW_2$). In the example shown, the water vapor transmission rate $TW_1$ of the diffusion barrier layer 38 is less than 1 $g/(m^2 \, d)$; the water vapor transmission rate $TW_2$ of a layer which consists of the material of the adhesive layer 33 and has the same thickness as the diffusion barrier layer 38 is typically at least several orders of magnitude higher.

The diffusion barrier layer 38 in the example shown is formed of $Al_2O_3$. Alternatively or additionally, the diffusion barrier layer 38 may also comprise other materials, which may be selected, for example, from the group comprising: $SiO_2$, $Ta_2O_5$, Al, Ta, Ti, Ru, $Si_xC_yO_zH_v$, $TiO_2$, $HfO_2$, $ZrO_2$, $La_2O_3$, $Nb_2O_5$, parylenes, fluoropolymers, in particular polytetrafluoroethylene, and also mixtures thereof. The coating 37 or the diffusion barrier layer 38 may be applied in different ways to the surface 33a of the adhesive layer 33—for example, by deposition from the gas phase, i.e., by PVD, CVD, such as by plasma-enhanced CVD, by ALD, by plasma ALD, by sputtering, by arc coating, or else by spin coating or in a sol-gel process. The process parameters when applying the coating 37 or the diffusion barrier layer 38 are typically selected such that it can be applied with a high density and as far as possible without pinholes to the surface 33a of the adhesive layer 33.

In order to make the coating 37 more impervious to the penetration of water vapor 36, the surface 38a of the diffusion barrier layer 38, which forms the top side of the coating 37, may undergo a surface treatment. The surface treatment may be, for example, a plasma treatment or an irradiation of the surface 38a with short wave, optionally pulsed radiation, in the UV wavelength range, for example, or may be produced by a coating or a surface termination. A particular possible effect of the surface treatment is that the surface 38a of the diffusion barrier layer 38 has hydrophobic properties—that is, that it is water-repellent. Additionally or alternatively, the diffusion barrier layer 38 may itself be formed of a hydrophobic material, such as of a fluoropolymer, for example, including in particular a Teflon-containing fluoropolymer—it may be formed of Teflon AF from Dupont, for example.

In order to increase the effect as a diffusion barrier, the coating 37 may have two or more diffusion barrier layers 38 made of different materials, optionally applied with different processes. This is advantageous in particular if a coating 37 composed of a single diffusion barrier layer 38 were to have a thickness sufficient as to pose a risk of delamination of the diffusion barrier layer 38. Typical thicknesses of the coating 37 or of the diffusion barrier layer 38 are situated in the order of magnitude of around 10 nm to 100 μm. It may also be advantageous to apply a plurality of diffusion barrier layers 38 one above another, since pinholes or defects in one layer are not continued in pinholes or defects in the following layer.

Figure 5:
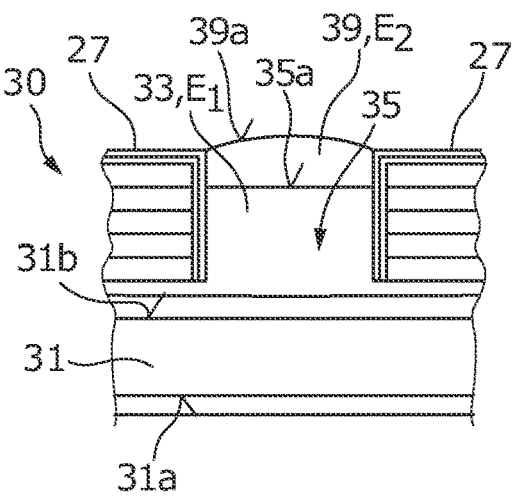
FIG. 5 shows a schematic representation analogous to FIG. 4, in which the surface of the adhesive layer is covered by an elastic filling material.

FIG. 5 shows an example of a mirror arrangement 30 wherein the surface 33a of the adhesive layer 33 is covered completely, in the interspace 35 between the two adjacent actuators 27, by a filling material 39 which has an elasticity modulus $E_1$ that is lower than the elasticity modulus $E_2$ of the adhesive layer 33. In the example shown, the elasticity modulus $E_1$ of the filling material 39 is less than 1500 MPa, preferably less than 1000 MPa, in particular less than around 500 MPa. Conversely, the elasticity modulus $E_2$ of the adhesive of the adhesive layer 33, based on epoxy resin, for example, is situated typically in the order of magnitude of around 3000 MPa to around 6000 MPa. In the example shown, the filling material 39 is a solid, more specifically an elastomer (rubber). In the example shown in FIG. 5, the penetration of water into the filling material 39 is indeed not prevented, but because of its lower elasticity modulus $E_1$, the elastic filling material 39 transmits considerably less force to the two adjacent actuators 27 than is the case for the adhesive layer 33. The filling material 33 may optionally likewise form a diffusion barrier; in other words, in addition to the comparatively low elasticity modulus $E_1$, this material may have a water vapor transmission value $TW_1$ which is lower than the water vapor transmission value $TW_2$.

Instead of rubber, the filling material 39 may also comprise a different elastic and/or ductile material, such as, for example, wax or grease—vacuum grease for example. The filling material 39 may also be a liquid, in particular a nonpolar liquid—an oil, for example. It is advantageous if the filling material 39 is itself hydrophobic, as is generally the case with grease or with oil, for example. The surface 39a of the filling material 39 may optionally be rendered hydrophobic by a surface treatment, as for example by a plasma treatment or by irradiation with UV radiation.

Figure 6:
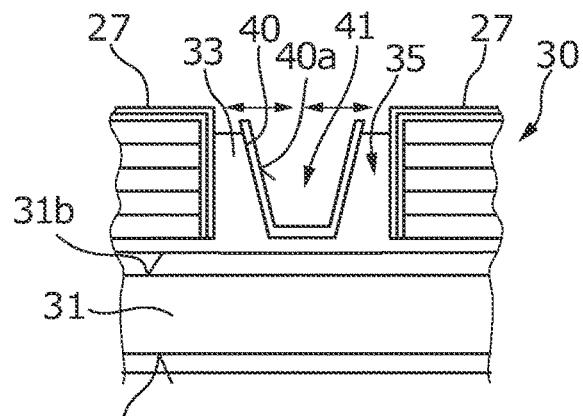
FIG. 6 shows a schematic representation analogous to FIG. 4, in which a depression covered by a film is formed in the adhesive layer.

FIG. 6 shows an example of a mirror arrangement 30 wherein a flexible material in the form of a film 40 is introduced into the interspace 35 between adjacent actuators 27. The film 40 protrudes into the interspace 35, meaning that said film extends from the top side of the two actuators 27 downward in the direction of the rear side 31a of the substrate 31. In the example shown in FIG. 5, the film 40 covers a pot-shaped depression 41 formed in the adhesive layer 33. In the example shown in FIG. 5, the depression 41 extends in the interspace 35 until approximately the level of the bottom side of the actuators 27. As a result of the depression 41, the volume of adhesive located within the interspace 35 is reduced. This is advantageous in order to reduce the so-called long-term adhesive drift, in which the entire volume of the adhesive layer 33 sorbs or releases water and leads to stresses in the substrate 31.

In the example shown in FIG. 6 the film 40 is not connected to the two adjacent actuators 27. In this way, the free ends of the film 40, which project upward slightly over the surface 33a of the adhesive layer 33, are able to move toward one another and away from one another when an adhesive drift occurs, this being indicated in FIG. 5 by two horizontal double arrows. The film 40 may likewise form a diffusion barrier, meaning that it may consist of or comprise a material which prevents or reduces the penetration of water vapor into the adhesive layer 33. The film 40 may comprise, for example, an aluminum-laminated polymer film. The film 40 may also be formed of a hydrophobic material or may have a hydrophobic surface 40a in order to reduce the sorption of water. The film 40 may have a hydrophobic coating, of Teflon AF, for example, in particular on the surface 40a, this coating acting additionally as a diffusion barrier.

The application of a film 40 to the adhesive layer 33 may also be useful in the event that the adhesive layer 33, in contrast to the illustration in FIG. 5, has a thickness D which corresponds to the distance between the bottom side of a respective actuator 27 and the rear side 31a of the substrate 31 or the top side of the interlayer 34. In this case the film 40 does typically protrude into the interspace 35, but does not form a depression in the adhesive layer 33. The film 40 in this case may completely cover, in particular, the interspace 35 or the surface 33a of the adhesive layer 33 in the interspace 35.

As well as the amount of the force exerted by the adhesive of the adhesive layer 33 on the actuators 27, another relevant factor is the force direction of the force exerted on the actuators 27; as far as the lever effect is concerned, a force direction which is oriented perpendicular to the side faces of the actuators 27 (cf. FIG. 3) is particularly deleterious. Because, in the event of short-term adhesive drift, in the context of the sorption and the release of water, the force direction runs substantially parallel to the surface 33a of the adhesive layer 33, one possibility for reducing deformations in the substrate 31 is to alter the orientation of the surface 33a of the adhesive layer 33 with respect to the actuators 27 or to the rear side 31b of the substrate 31.

Figure 7:
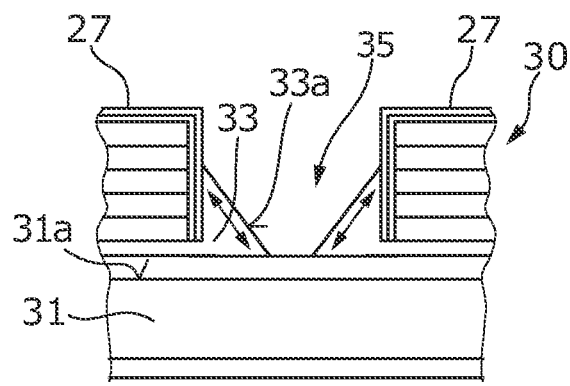
FIG. 7 shows a schematic representation analogous to FIG. 4, in which the adhesive layer is interrupted in the interspaces between the actuators.

In the example shown in FIG. 7, this is achieved by interruption of the adhesive layer 33 in a respective interspace 35 between the actuators 27; in other words, the layer 33 does not completely cover the interspace 35. As a result of the interruption of the adhesive layer 33, the surface 33a of the adhesive layer in the interspaces 35 is oriented diagonally to the rear side 31a of the substrate 30 and to the side faces of the actuators 27. Accordingly, the force effect of the adhesive layer 33 on sorption of water is also oriented diagonally to the side faces of the actuators 27, as is indicated in FIG. 7 by two double arrows. As a result of the interruption of the adhesive layer 33 in the interspace 35, however, the surface 33a of the adhesive layer 33 is increased in comparison to a continuous adhesive layer 33. Accordingly, in the case of the example shown in FIG. 7, it is necessary to select the geometry of the adhesive layer 33 in such a way, that in spite of the enlarged surface 33a and hence a larger absolute amount of the force, the force effect exerted by the actuators 27 on the substrate 31 is reduced by a suitably steep orientation of the surface 33a of the adhesive layer 33.

Figure 8:
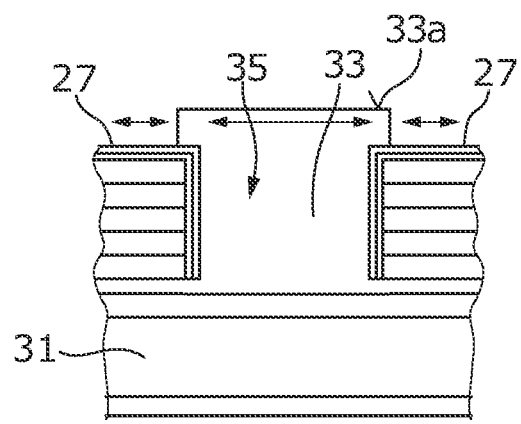
FIG. 8 shows a schematic representation analogous to FIG. 4, in which the adhesive layer projects over the actuators in an interspace.

In the example described in FIG. 8 there is a decoupling between the actuators 27 and the force effect generated in the adhesive of the adhesive layer 33. This is achieved by virtue of the fact that in the interspace 35 between two adjacent actuators 27, the adhesive layer 33 projects over the actuators 27, more specifically over their top side. In contrast to the illustration in FIG. 3, therefore, the adhesive layer 33 does not have a uniform thickness D; instead, its thickness is increased in the interspaces 35 by the thickness of the projecting part of the adhesive layer 33. On sorption of water, where the adhesive layer 33 undergoes a force effect in the horizontal direction, the adhesive layer 33 may expand laterally over a respective interspace 35, as indicated in FIG. 8 by two double arrows. In this way, the transmission of force from the adhesive layer 33 to the actuators 27 and hence to the substrate 31 may be effectively reduced.

Figure 9:
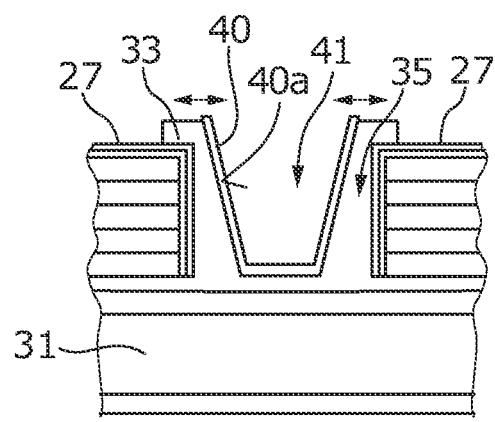
FIG. 9 shows a schematic representation of the adhesive layer, in which the film represented in FIG. 6 is combined with the projecting adhesive layer of FIG. 8.

In the case of the example shown in FIG. 8, the short-term adhesive drift may be compensated, with only the upper portion of the adhesive layer 33 participating in the diffusion processes. In order to reduce the long-term adhesive drift as well, the projecting adhesive layer 33 may be partially covered with a film 40 which covers a depression 41 in the adhesive layer 33, as shown in FIG. 9. In the case of the mirror arrangement 30 shown in FIG. 9, therefore, the measures set out in FIG. 8 and in FIG. 6 are combined. In this case it is possible to reduce the volume of the adhesive layer 33 in the interspace 35 via the coverage with the film 40, and consequently the long-term adhesive drift of the adhesive layer 33 is reduced as well.

Figure 10:
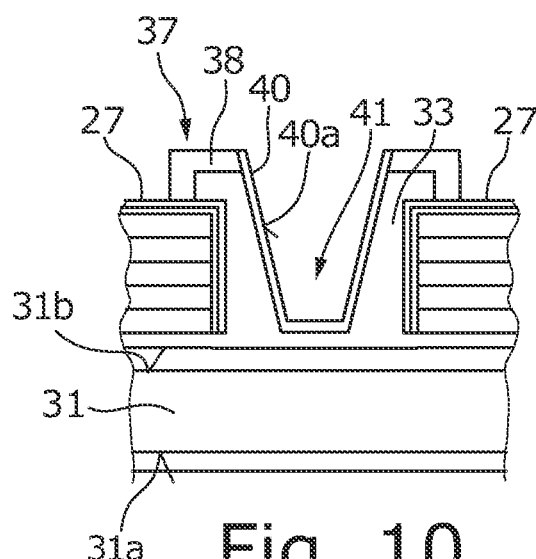
FIG. 10 shows a schematic representation of the adhesive layer of FIG. 9, with a coating serving as a water vapor diffusion barrier being applied on the exposed surface of said layer.

FIG. 10, lastly, shows a mirror arrangement 30 in which, in addition to the measures set out in FIG. 9, the projecting portion of the surface 33a of the adhesive layer 33—the portion not covered by the film 40—is covered by a coating 37, more specifically by a diffusion barrier layer 38. Where the film 40 forms a diffusion barrier as well, the surface 33a of the adhesive layer 33 is in this case protected completely against the penetration of water vapor 36.

The adhesive drift and/or the effect of the adhesive drift on the substrate can be reduced by one of the measures described earlier on above or by a combination of two or more of these measures. In this way it is possible to reduce aberrations of the EUV lithography unit 1 or of the DUV lithography unit 100 which are attributable to the adhesive drift. The start-up of the EUV lithography unit 1 or of the DUV lithography unit 100 can also be accelerated after a change in the humidity in the surroundings of the mirror arrangement 30, because the time needed to attain a steady state, in which the adhesive layer 33 is in dynamic equilibrium with the surroundings, is reduced in the manner described above.

What is claimed is:

1. A mirror arrangement comprising:
   a substrate which has a front side having a mirror face for reflecting radiation, and a rear side facing away from the front side and on which at least two actuators for generating deformations of the mirror face are disposed,
   wherein a water vapor sorbing material is formed as an adhesive layer arranged on the rear side of the substrate arranged in interspaces between the actuators, and arranged directly on a side of the actuators opposite the substrate;
   wherein an edge of the actuators remote from the rear side of the substrate is completely covered by the vapor sorbing material.

2. The mirror arrangement as claimed in claim 1, wherein the actuators are configured as piezo actuators.

3. An optical arrangement in an extreme ultraviolet (EUV) lithography apparatus or a deep ultraviolet (DUV) lithography apparatus, comprising: at least one mirror arrangement as claimed in claim 1.

4. The mirror arrangement as claimed in claim 1, wherein the actuators are configured as electrostrictive actuators.

5. The mirror arrangement as claimed in claim 1, wherein the adhesive layer has an elasticity modulus between 3000 MPa and 6000 MPa, inclusive.

6. The mirror arrangement as claimed in claim 1, wherein a diffusion barrier layer is formed on a surface of the adhesive layer.

7. The mirror arrangement as claimed in claim 6, wherein the diffusion barrier layer comprises a material selected from the group consisting of $SiO_2$, $Ta_2O_5$, Al, Ta, Ti, Ru, $Si_xC_yO_zH_v$, $TiO_2$, $HfO_2$, $ZrO_2$, $La_2O_3$, $Nb_2O_5$, parylenes, fluoropolymers, and mixtures thereof.

8. The mirror arrangement according to claim 1, wherein edge of the actuators is arranged substantially perpendicularly to the rear side of the substrate.

* * * * *